United States Patent [19]

Feldman et al.

[11] Patent Number: 5,221,501
[45] Date of Patent: Jun. 22, 1993

[54] METHOD OF PRODUCING A SMOOTH PLATE OF DIAMOND

[75] Inventors: Albert Feldman, Rockville; Edward N. Farabaugh, Mount Airy, both of Md.

[73] Assignee: The United States of America as represented by the Secretary of Commerce, Washington, D.C.

[21] Appl. No.: 713,297

[22] Filed: Jun. 11, 1991

[51] Int. Cl.$^5$ .................. B29D 11/00; B29C 39/00; C23C 16/00

[52] U.S. Cl. .................................. 264/1.2; 264/1.4; 264/1.7; 264/22; 264/39; 264/81; 264/259; 264/261; 423/446; 204/157.41; 204/157.43

[58] Field of Search ............... 264/22, 81, 1.2, 1.7, 264/39, 261, 259, 1.4; 427/162, 237, 249, 299; 423/446; 204/157.41, 157.43, 157.47

[56] References Cited

U.S. PATENT DOCUMENTS

| | | | |
|---|---|---|---|
| 4,186,164 | 1/1980 | Spivack | 264/81 |
| 4,590,024 | 5/1986 | Lesk et al. | 264/81 |
| 4,907,846 | 3/1990 | Tustison et al. | 350/1.6 |
| 4,915,977 | 4/1990 | Okamoto et al. | 427/37 |
| 4,939,043 | 7/1990 | Biricik et al. | 428/620 |
| 4,939,763 | 7/1990 | Pinneo et al. | 378/161 |
| 5,100,599 | 3/1992 | Gurnick et al. | 264/81 |
| 5,130,111 | 7/1992 | Pryor | 501/86 |

OTHER PUBLICATIONS

"Diamonds Out of Thin Air", *The Washington Post*, Aug. 19, 1990, by Ivan Amato.
"Diamond Fever", *Science News*, vol. 138, pp. 72-74, by Ivan Amato.
William D. Partlow et al. "CVD Diamond Coatings for the Infrared by Optical Brazing," in Applications of Diamond Films and Related Materials, (1991) pp. 163-168.

*Primary Examiner*—Jan H. Silbaugh
*Assistant Examiner*—Christopher A. Fiorilla
*Attorney, Agent, or Firm*—James O. Oliff; Steve Roe

[57] ABSTRACT

An improved method of producing transparent diamond laminates employs a substrate which is removed once a second layer is deposited over the diamond coating, thereby exposing a smooth diamond surface. The second coating should have a refractive index substantially identical to diamond, with zinc selenide and titanium dioxide being particularly preferred. Diamond films having two smooth surfaces may be produced by simultaneous deposition on parallel, opposed substrates until the two diamond films merge together to form a single film or plate, followed by removal of at least a portion of the two substrates.

22 Claims, 3 Drawing Sheets

INDEX MATCHING LAYER

DIAMOND COATING

SUBSTRATE

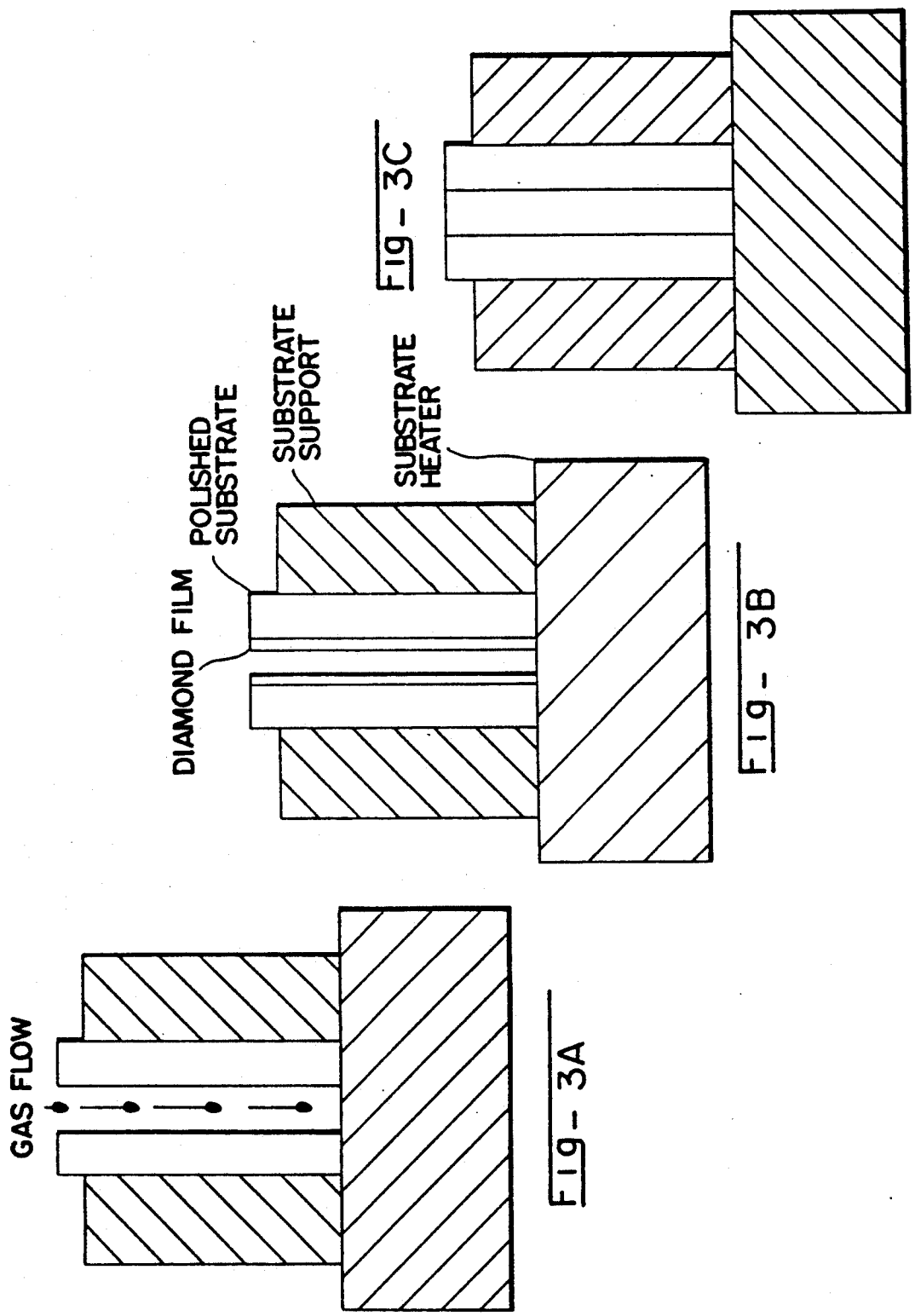

METHOD OF PRODUCING A SMOOTH PLATE OF DIAMOND

BACKGROUND OF THE INVENTION

This invention relates to the production of synthetic diamond films. More particularly, the present invention relates to diamond coated laminates suitable for visible and infrared optical devices, and methods for production of diamond films and diamond coated laminates.

Chemical vapor deposition of diamond films onto substrates is known. Such diamond coatings typically nucleate at discrete sites, forming crystalline particles that merge into a film when the sizes of the growing particles exceed the particle spacing. The growth surfaces of such films possess a large surface roughness that scatters optical radiation and thus lowers the optical transparency of the film.

The art has attempted to overcome this disadvantage of diamond films by substrate pretreatment in which a diamond paste or diamond powder is used to polish the substrate, which is then cleaned prior to deposition of the diamond film. Such pretreatment is effective to increase the nucleation density of the deposited film, and thus reduce overall surface roughness and improve transparency. However, such substrate surface pretreatment methods are labor intensive, time consuming and costly.

Methods for nucleating films of diamond microcrystallites which produce smoother and thus more transparent diamond films have been reported. However, these methods are limited to films having a thickness of less than 3 millionths of a meter.

U.S. Pat. No. 4,939,763 to Pinneo et al discloses a method for making synthetic diamond films which are transmissive to X-ray radiation in which diamond is deposited upon a substrate to a preselected thickness, selected areas of the opposite surface of the substrate are masked, and the unmasked areas are removed by etching to expose the diamond film. Alternatively, the entire substrate may be etched away.

U.S. Pat. No. 4,907,846 to Tustison et al discloses thick, impact resistant antireflection coatings for infrared transparent optical elements such as zinc selenide and zinc sulfide comprising an impact protection material having a relatively high modulus of elasticity compared to the modulus of elasticity of the optical element material. An antireflection layer is deposited over the impact protection layer. Hard carbon, diamond, cerium oxide, titanium oxide, zirconium oxide, and mixtures thereof may be used as the impact protection layer if a yttrium oxide adhesion layer is interposed between the optical element and the impact protection layer. Differences in optical matching between the antireflection layer and the IR transparent substrate are compensated by adjusting the thickness of the antireflection layer to a quarter wavelength of the wavelength which is desired to be maximally transmitted through the optical element.

U.S. Pat. No. 4,915,977 to Okamoto et al discloses an improved method of forming a diamond film on a substrate in which a first gas selected from the group consisting of hydrogen, inert gases, organic compound gases and mixtures thereof is introduced into a vacuum vessel to contact a substrate housed therein, and carbon is evaporated onto the substrate by arc discharge at a carbon cathode while a negative voltage is applied to the substrate or substrate holder, to form a diamond film on the substrate.

U.S. Pat. No. 4,939,043 to Biricik et al discloses an infrared transparent, electrically conductive semiconductor window comprising a substrate of zinc selenide or zinc sulfide and a thin coating of doped semiconductor material selected from the group consisting of gallium arsenide, gallium aluminum arsenide, semiconducting diamond, zinc selenide, zinc oxide, zinc sulfide, silicon, germanium, and semiconducting silicon carbide.

One object of the present invention is to provide a relatively economical and rapid method for the production of a transparent diamond film suitable for use in an optical device.

Another object is to provide a method for production of a transparent diamond film having a thickness greater than 3 millionths of a meter.

A further object is to provide a method for production of a diamond film having two smooth surfaces, which is suitable for use in an optical device.

BRIEF SUMMARY OF THE INVENTION

In one aspect, the present invention is a method of producing a diamond coated optical laminate, comprising:
 i) depositing a diamond coating on a smooth substrate;
 ii) depositing a coating of a second material having an index of refraction substantially identical to diamond on said diamond coating;
 iii) removing said substrate to expose at least a portion of said diamond film coating.

In another aspect, the present invention is a diamond coated laminate, comprising a diamond film having a smooth outer surface and a rough inner surface, with said rough inner surface adherent to a second film having an index of refraction substantially identical to diamond at visible and/or infrared wavelengths.

In yet another aspect, the present invention is a method for producing a polished plate of chemical vapor deposited diamond, comprising
 i) placing two polished substrates in opposed parallel relationship;
 ii) simultaneously depositing a diamond film on said two polished surfaces by a chemical vapor deposition process until the two diamond films merge into a single film or plate.

BRIEF DESCRIPTION OF THE DRAWINGS

FIGS. 3A-C show the steps of a process for producing a diamond film having two polished surfaces according to the invention.

DETAILED DESCRIPTION OF THE PREFERRED EMBODIMENTS

Figure 1D:
FIGS. 1A-D illustrate the steps of a process for producing a diamond laminate according to the invention.

The substrate used in the present invention may be any substrate which has a sufficiently smooth surface and which can be used in chemical vapor deposition of a diamond film. Suitable substrates include silicon wafers, fused silica, alumina, silicon-carbide, silicon-nitride, molybdenum, titanium and copper. Silicon is preferred. The required degree of smoothness may be achieved by pretreatment, such as by polishing the substrate with diamond paste and subsequently cleaning the substrate prior to deposition of the diamond film.

The diamond film is preferably deposited by a chemical vapor deposition process. Such processes are well known to those of ordinary skill in the art, and include hot filament CVD, electron assisted CVD, microwave assisted CVD, radio-frequency assisted CVD, oxyacetylene torch CVD, DC discha CVD, hot plasma jet CVD, magnetic field enhanced CVD, and laser assisted CVD.

A carbon-containing gas may be mixed with hydrogen and the mixture employed in such chemical vapor deposition techniques to provide the carbon which forms the diamond film on the substrate. Suitable carbon-containing gases include hydrocarbons such as methane, ethane and acetylene, and oxygenated hydrocarbons, such as methyl alcohol, ethyl alcohol, and acetone. Deposition is typically performed at an elevated temperature, for example, 400° C. to 1,000° C.

The diamond film produced by the deposition has a rough surface which renders it unsuitable for optical applications without further processing. A layer of a second material which has an index of refraction substantially identical to diamond is then deposited on the rough diamond surface, preferably by chemical vapor deposition. The second material may be any material which can be uniformly deposited upon a diamond film to form a second layer which possesses a substantially identical index of refraction compared to the diamond film in at least one portion of the electromagnetic spectrum. By "substantially identical" it is meant that, at a desired wavelength, substantially no light is lost to refraction or scattering at the diamond/second material interface, either due to essentially identical indices of refraction or to optical design techniques such as those disclosed in U.S. Pat. No. 4,907,846, the disclosure of which is expressly incorporated by reference herein. Suitable second materials include zinc selenide and zinc sulfide, which possess an index of refraction substantially identical to diamond in the infrared portion of the spectrum, and titanium dioxide, which has an index of refraction substantially identical to diamond in the visible portion of the spectrum.

After the second material is deposited to a desired thickness, the outer surface of the second material is either naturally optically smooth or is subsequently polished to optical smoothness. The substrate is removed, preferably by etching, to expose a smooth diamond surface which is believed to be eminently suitable for optical applications. The previously exposed rough diamond surface does not detract from the optical clarity of the diamond laminate because the second material, which possesses a substantially identical optical refractive index, is adherent to and covers the rough diamond surface.

Conventional etchants may be employed in conventional etching processes to remove all of the substrate. Alternatively, selected portions of the substrate may be marked prior to etching so that only portions of the substrate are removed. A suitable etchant comprises HF and nitric acid in a 1:3 volume ratio.

The second material is preferably polished prior to removal of the substrate, and may be optionally coated with a protective coating prior to removal of the substrate. Suitable protective coatings include yttrium oxide, scandium oxide and aluminum oxide. The third material may have an index of refraction of about 1.55 so as to prevent reflection of optical energy from the atmosphere.

Figure 1C:
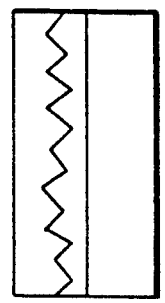
Figure 1B:
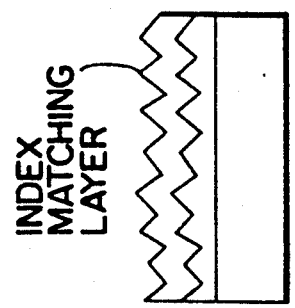
Figure 1A:
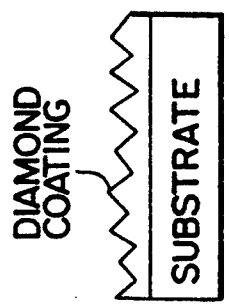

The above described process is illustrated in FIGS. 1A-D, in which a diamond film or plate is deposited onto a suitably smooth substrate. As shown in FIG. 1A, the deposited diamond film or plate has a rough surface. A second layer, optically matched to the first layer, is then deposited onto the diamond film or plate, as illustrated by FIG. 1B. The surface of the second layer, which is softer than the diamond film or plate, is preferably polished to optical smoothness (FIG. 1C). The substrate, or a portion thereof, is then removed to produce a diamond laminate having a smooth diamond surface (FIG. 1D).

Figure 2A:
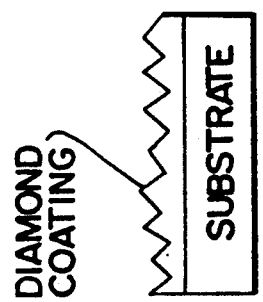
FIGS. 2A-E depict the steps of a process for producing an optical device using a diamond laminate according to the invention.
Figure 2B:
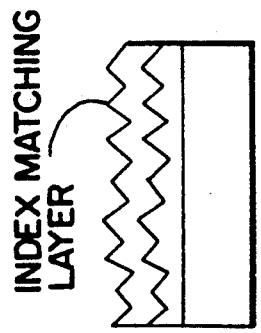
Figure 2C:
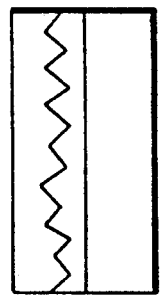
Figure 2D:
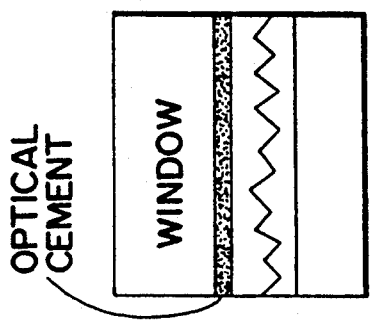
Figure 2E:
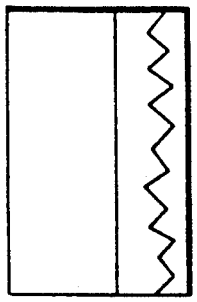

A modification of the above described process is depicted in FIGS. 2A-E, in which a window is cemented to the second material prior to removal of the substrate. A diamond film or plate is first deposited upon a suitably smooth substrate (FIG. 2A). An optically matched second material is deposited upon the rough surface of the diamond film or plate (FIG. 2B). The layer of deposited second material is preferably polished to optical smoothness (FIG. 2C). The second material/diamond/substrate laminate is then bonded to a transparent window (FIG. 2D), prior to etching at least a portion of the substrate to expose a smooth diamond surface (FIG. 2E).

In a second embodiment, two polished substrates are used to produce a single film or plate of diamond. The polished substrates are placed in opposed parallel relationship, and a diamond film is simultaneously deposited on the two polished surfaces by a chemical vapor deposition process until the two diamond films merge into a single film. The two substrates may be subsequently removed from the single film of diamond to produce a diamond film having two polished sides.

The same substrates useful in the first embodiment described above are suitable for producing a single diamond film or plate having two smooth surfaces. The substrates are preferably polished with diamond paste or diamond powder and cleaned prior to simultaneous deposition of the diamond films.

The same chemical vapor deposition methods described above are suitable for producing a diamond film having two polished surfaces. The substrates are heated to an appropriate temperature for diamond film formation and a reactive gas is made to flow or diffuse between the substrates, which results in the formation of diamond film growth on both substrates. Unless deposition is terminated, the diamond films will increase in thickness until they merge into a single film or plate. One or both of the two substrates may then be removed, preferably by etching, leaving a diamond film or plate having at least one polished surface.

The process of the second embodiment is graphically illustrated in FIGS. 3A-C. FIG. 3A shows one possible deposition arrangement, in which a reactive gas is made to flow between two substrates having polished surfaces in opposed relationship. During deposition a diamond film or plate is deposited on both polished substrate surfaces (FIG. 2B). The two diamond films will continue to increase in thickness until they merge into a single diamond film or plate sandwiched between two substrates (FIG. 3C). At least a portion of each of the two substrates are etched away to produce a diamond film or plate having two optically smooth surfaces.

It is possible that voids will be formed either during deposition upon both substrates or at the point of joinder between the two growing diamond surfaces The inventors believe that any such void formation may be compensated by introducing a temperature gradient which will cause the diamond films to close up at one end of the laminate near a substrate heater and grow up toward the incoming gas stream. The high thermal conductance of diamond would allow the advancing closure surface to remain at a temperature close to the temperature of the substrate heater. The substrate would be maintained at a temperature which will permit the high diffusivity of atomic hydrogen to transport carbon for filling in any such voids.

What is claimed is:

1. A method for producing a diamond laminate, comprising:
   i) placing two planar substrates in an opposed parallel relationship, each substrate having a smooth surface, the two smooth surfaces facing each other to define a smooth channel between the two planar substrates; and
   ii) simultaneously depositing a diamond film on said two smooth surfaces of said two planar substrates by a deposition process until the two diamond films merge into a single diamond film.

2. The method of claim 1 wherein at least a portion of at least one of said substrates is removed subsequent to depositing said diamond film to expose at least a portion of at least one diamond surface.

3. The method of claim 2 wherein at least two diamond surfaces are exposed.

4. The method of claim 3 wherein said exposed diamond surfaces are opposite one another.

5. A method for producing a smooth plate of diamond, comprising:
   i) placing two planar substrates in an opposed parallel relationship, each substrate having a smooth surface, the two smooth surfaces facing each other to define a smooth channel between the two planar substrates;
   ii) simultaneously depositing a diamond film on said two smooth surfaces of said two planar substrates by a deposition process until the two diamond films merge into a single diamond film; and
   iii) detaching at least one of said two planar substrates from said single diamond film.

6. The method of claim 5 wherein said substrates are polished with diamond paste or diamond powder and cleaned prior to simultaneous deposition of the diamond films.

7. The method of claim 5, wherein said deposition process is performed by heating said substrates and flowing reactive gas between said substrates from at least one gas inflow direction.

8. The method of claim 7, further comprising the step of preferentially heating the two planar substrates to create a temperature distribution in the two substrates parallel to the two smooth surfaces.

9. The method of claim 5, wherein said substrates are polished with a diamond paste and cleaned prior to depositing said diamond coating.

10. The method of claim 5, wherein said substrates are selected from the group consisting of silicon wafers, fused silica, alumina, silicon-carbide, silicon-nitride, molybdenum, titanium and copper.

11. The method of claim 10, wherein said substrates are silicon.

12. The method of claim 5, wherein said diamond is deposited by a chemical vapor deposition process.

13. The method of claim 5, wherein said chemical vapor deposition process is selected from the group consisting of hot filament CVD, electron assisted CVD, microwave assisted CVD, radio-frequency assisted CVD, oxyacetylene torch CVD, DC discharge CVD, hot plasma jet CVD, magnetic field enhanced CVD, and laser assisted CVD.

14. The method of claim 12, wherein a carbon-containing gas is selected from the group consisting of hydrocarbon and oxygenated hydrocarbon, mixed with hydrogen and the mixture employed in said chemical vapor deposition process.

15. The method of claim 14, wherein said hydrocarbon is at least one member selected from the group consisting of methane, ethane and acetylene.

16. The method of claim 14, wherein said oxygenated hydrocarbon is at least one member selected from the group consisting of methyl alcohol, ethyl alcohol and acetone.

17. The method of claim 5, wherein said substrate is removed by etching.

18. The method of claim 5, wherein the single film is a monolithic diamond film.

19. The method of claim 5, wherein said deposition process is performed by heating said substrates and flowing reactive gas between said substrates from at least one gas inflow location.

20. The method of claim 19, further comprising the step of preferentially heating the two planar substrates to create a temperature distribution in the two substrates parallel to the two smooth surfaces.

21. The method of claim 20, wherein a highest temperature of the temperature distribution in the two substrates is located on a portion of the substrates furthest from the at least one inflow location of the reactive gas between the two planar substrates.

22. The method of claim 5, wherein said detaching step comprises removing both of said two planar substrates from said single diamond film.

* * * * *